(12) United States Patent
Crass et al.

(10) Patent No.: US 6,252,378 B1
(45) Date of Patent: Jun. 26, 2001

(54) USAGE COUNTER FOR PORTABLE JUMP-STARTING BATTERY UNIT

(75) Inventors: Matthew M. Crass, Pleasant Prairie; Thomas P. Becker, Kenosha, both of WI (US)

(73) Assignee: Snap-on Technologies, Inc., Lincolnshire, IL (US)

(*) Notice: Subject to any disclaimer, the term of this patent is extended or adjusted under 35 U.S.C. 154(b) by 0 days.

(21) Appl. No.: 09/596,932

(22) Filed: Jun. 19, 2000

Related U.S. Application Data

(60) Provisional application No. 60/175,363, filed on Jan. 10, 2000.

(51) Int. Cl.[7] ........................................... H02J 7/00
(52) U.S. Cl. ............................................. 320/132
(58) Field of Search .................... 320/132, 136, 320/DIG. 18; 429/90, 91; 324/433, 436; 340/636

(56) References Cited

U.S. PATENT DOCUMENTS

| | | | |
|---|---|---|---|
| 4,920,549 | 4/1990 | Dinovo | 377/16 |
| 5,029,188 | 7/1991 | Lexa | 377/16 |
| 5,136,620 | 8/1992 | Eaves | 377/15 |
| 5,231,594 | 7/1993 | Knibiehler et al. | 702/177 |
| 5,372,898 * | 12/1994 | Atwater et al. | 320/136 |
| 5,530,362 | 6/1996 | Boehm et al. | 324/427 |
| 5,545,491 | 8/1996 | Farley | 429/7 |
| 5,581,463 | 12/1996 | Constant et al. | 705/400 |
| 5,592,095 * | 1/1997 | Meadows | 320/149 |
| 5,608,306 | 3/1997 | Rybeck et al. | 320/106 |
| 5,617,008 | 4/1997 | Eastmond et al. | 320/133 |
| 5,640,150 | 6/1997 | Atwater | 340/636 |
| 5,825,156 | 10/1998 | Patillon et al. | 320/134 |
| 5,895,440 | 4/1999 | Proctor et al. | 320/138 |
| 6,011,380 | 1/2000 | Paryani et al. | 320/132 |

* cited by examiner

*Primary Examiner*—Peter S. Wong
*Assistant Examiner*—Pia Tibbits
(74) *Attorney, Agent, or Firm*—Seyfarth Shaw

(57) ABSTRACT

A usage counter has input terminals connectable to the terminals of a jump-starting battery pack. The counter has an IC comparator which generates an output signal when battery voltage drops below a predetermined reference level. If the output signal persists for a predetermined time period, indicating an attempt to jump-start an engine with the battery pack, an IC timer is triggered to output a count pulse which is inverted and then counted and displayed by an IC counter/display circuit. The usage counter circuit is powered by the battery pack and has a Zener diode which provides to the IC circuits a limited supply voltage which is unaffected by voltage spikes which might appear at the battery pack terminals. A capacitor maintains the reference voltage level despite momentary drops in battery terminal voltage.

12 Claims, 1 Drawing Sheet

USAGE COUNTER FOR PORTABLE JUMP-STARTING BATTERY UNIT

RELATED APPLICATION

This application claims the benefit of the filing date of copending U.S. provisional application No. 60/175,363, filed Jan. 10, 2000.

BACKGROUND

This application relates to battery or power packs of the rechargeable type and, in particular, to lead-acid, thin metal film battery packs. The application relates in particular to determining the cycle life of lead-acid battery packs for uses, such as jump-starting automotive vehicles.

It is known to provide battery packs, i.e., compact arrangements of one or more cells, for various DC power delivery applications. One such application is for use in jump-starting automotive vehicles. Such battery packs typically use lead-acid batteries, some of which have recently been of the thin metal film type. Such thin metal film lead-acid batteries are sold, for example, by Johnson Controls, Inc. under the designation "Inspira" and by Bolder Technologies under the designation "Bolder 9/5 Sub-C TMF" (Thin Metal Film).

It is desirable to provide a simple apparatus for determining the practical cycle life of jump-starting battery packs, particularly during development of prototype units, in terms of the number of usage cycles, such as jump starts or jump start attempts, which can be effected by the unit.

SUMMARY

This application discloses an improved test and monitoring circuit for use with jump-starting battery packs.

An important aspect is the provision of a circuit for monitoring the number of vehicle start attempts performed by a portable jump-starting battery unit.

Another aspect is the provision of a circuit of the type set forth, which detects automotive jump-starting attempts with minimal current draw.

Still another aspect is the provision of a circuit of the type set forth, which is of simple and economical construction.

In particular, there is provided an apparatus for determining the cycle life of a battery in terms of usage cycles, comprising a reference circuit adapted to be coupled to the battery and establishing a reference voltage level, a usage cycle detection circuit adapted to be coupled to the battery and to the reference circuit and generating a count signal in response to battery voltage dropping below the reference voltage level, and a counter circuit coupled to the detection circuit for counting the number of count signals generated.

BRIEF DESCRIPTION OF THE DRAWING

For the purpose of facilitating an understanding of the subject matter sought to be protected, there is illustrated in the accompanying drawing an embodiment thereof, from an inspection of which, when considered in connection with the following description, the subject matter sought to be protected, its construction and operation, and many of its advantages should be readily understood and appreciated.

The FIGURE is a schematic circuit diagram of a usage counter circuit connected to a battery pack.

DETAILED DESCRIPTION

Figure 1:
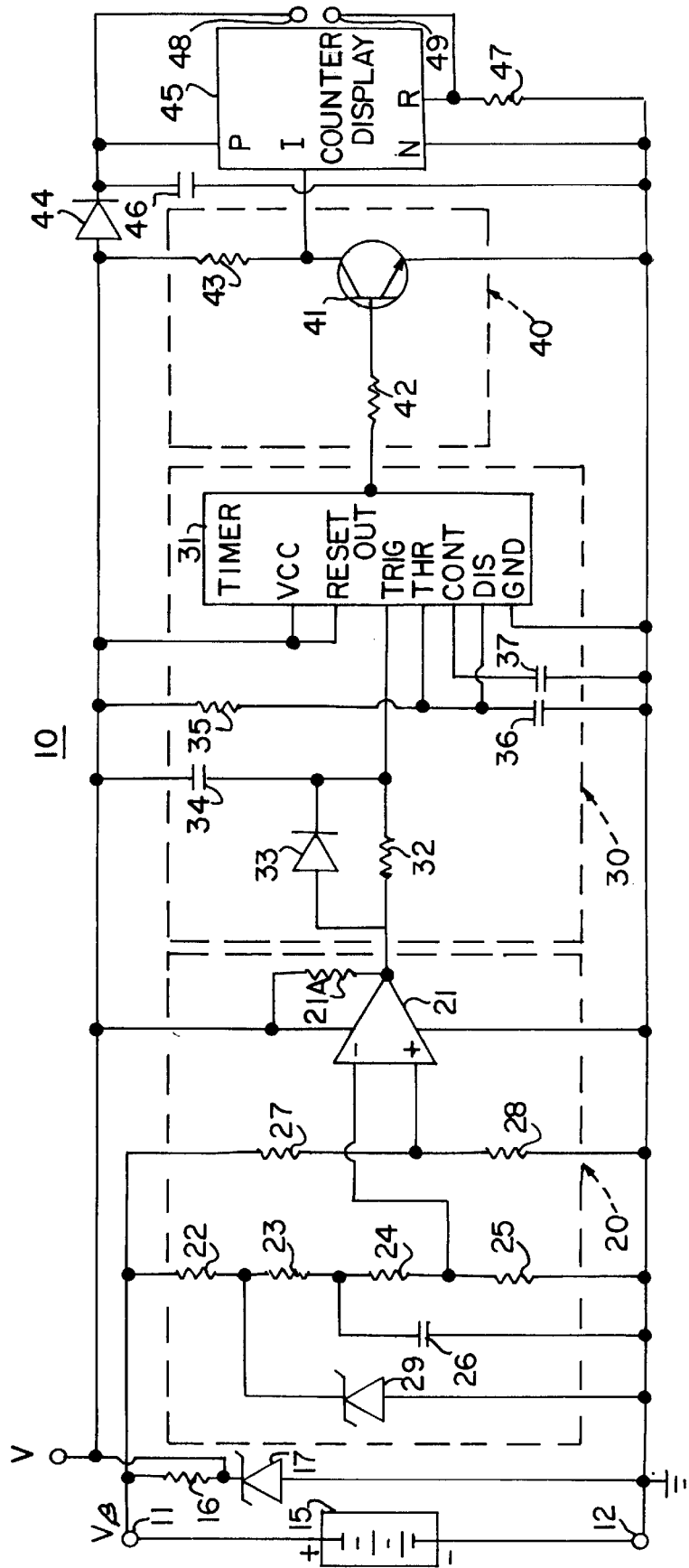

Referring to the FIGURE, there is illustrated a usage counter circuit, generally designated by the numeral 10, having input terminals 11 and 12 which are adapted to be connected, respectively, to the terminals of a battery pack 15, which has a terminal voltage $V_B$. The battery pack 15 is typically of a type used for jump-starting automotive vehicles and may be of the thin metal film, lead-acid type. In a constructional model, the counter circuit 10 is adapted to be used with a battery pack having a storage battery of the type sold by Johnson Controls, Inc. under the trade name "Inspira" and rated at 2.4 ampere-hours. However, it will be appreciated that the circuit 10 could be used with other types of portable jump-starting battery pack units.

Connected in a series across the input terminals 11, 12 are a resistor 16 and a Zener diode 17, for producing at the cathode of the Zener diode 17 a limited supply voltage V+.

The usage counter circuit 10 has a voltage comparator 20, which includes a reference circuit, described below, and an integrated-circuit ("IC") comparator 21 having supply terminals connected across the V+supply. The comparator 21 may be a CMOS comparator with open collector output, such as a TLC372, and has an output connected through a pull-up resistor 21a to the V+supply. Resistors 22, 23, 24 and 25 are connected in series across the terminals 11, 12, the junction between the resistor 24 and 25 being connected to the inverting input terminal of the IC 21 to provide a reference voltage. The junction between the resistors 23 and 24 is connected to ground through a capacitor 26, which causes the reference voltage to be unresponsive to transient battery voltage changes, such as those caused by attempts to start a vehicle. Resistors 27 and 28 are connected in series across the terminals 11, 12 and form a voltage divider which provides, at the junction therebetween, a comparison voltage connected to the non-inverting input terminal of the IC 21, which comparison voltage is instantaneously responsive to battery voltage changes. The junction between the resistors 22 and 23 is connected to the cathode of a Zener diode 29, the anode of which is connected to ground. The Zener diode 29 cooperates with the resistors 22–25 and the capacitor 26 to form the reference circuit.

The output of the comparator 20 at the output of the IC 21 is connected to a delayed trigger circuit 30, which includes a CMOS IC timer 31. More specifically, the output of the IC 21 is coupled through a resistor 32 to the trigger terminal of the timer 31, the resistor 32 being connected in parallel with a diode 33 having its anode connected to the output of the IC 21. The trigger terminal is also connected through a capacitor 34 to the V+supply. A resistor 35 and a capacitor 36 are connected in series across the V+supply, the junction therebetween being connected to threshold and discharge terminals of the timer 31. A control terminal of the timer 31 is connected through a capacitor 37 to ground. The VCC and reset terminals of the timer 31 are connected to the V+supply.

The output of the timer 31 is coupled to an inverter 40, which includes an NPN transistor 41. More specifically, the output of the timer 31 is coupled through a resistor 42 to the base of the transistor 41, the collector of which is connected with a resistor 43 to the V+supply, and the emitter of which is connected to ground. The output of the inverter 40, at the collector of the transistor 41, is coupled to the input terminal of an IC counter/display 45, the positive supply terminal of which is connected to the cathode of a diode 44, the anode of which is connected to the V+supply, the negative supply terminal of the counter/display 45 being connected to ground. A capacitor 46 is connected across the supply terminals of the counter/display 45. The reset terminal of the counter/display 45 is connected through a resistor 47 to ground. The positive supply terminal of the counter/display 45 is connected to a terminal 48, and a terminal 49 is connected to the reset terminal of the counter/display 45.

In operation, the usage counter circuit 10 will recognize an appreciable drop in battery voltage, such as is caused by an attempt to jump-start an automotive vehicle, and will increment the number on the display by one. In this regard, the comparator IC 21, the delayed trigger circuit 30 and the inverter 40 cooperate to function as a usage cycle detection circuit. When the battery pack 15 is in a non-used state, the voltage at the non-inverting input of the comparator IC 21 is slightly higher than the reference voltage at the inverting input terminal, and the output of the IC 21 is high, preferably about 12 volts. When the battery pack 15 is loaded by a vehicle starter, the voltage at the non-inverting input terminal of the IC 21 drops below the reference voltage and the output of the IC 21 goes low. This condition continues until the load is removed (the car starts or the starter is disengaged), allowing the battery voltage to rise, or until the capacitor 26 discharges (preferably after about 10 seconds), causing the reference voltage to drop below the comparison voltage.

In normal use, it is possible for the battery pack to experience instantaneous voltage drops caused by touching the battery leads together, connecting to a light load or the like. Such voltage drops would typically have a duration less than about one-tenth of a second. The delayed trigger 30 causes such instantaneous voltage drops to be ignored by the timer 31. More specifically, the timer 31 is designed to provide a count pulse each time the voltage at its trigger input drops below one-third of the VCC voltage. The capacitor 36 and the resistor 35 establish a pulse duration of preferably about one second, and the capacitor 37 adds stability to the timer. The resistor 32 and the capacitor 34 form an RC delay, such that when the voltage at the output of the comparator IC 21 goes low (to about zero volts), it takes at least 500 ms. for the timer trigger voltage to drop below one-third VCC. However, when the output of the timer IC 21 goes high, the diode 33 allows current to bypass the resistor 32, causing the trigger voltage of the timer 31 to rise immediately. If an undesirable instantaneous voltage drop, such as described above, occurs, the timer trigger voltage will not drop below one-third VCC before rising and a count pulse will not be generated by the timer 31. Only if the battery voltage drops for at least 500 ms., will a count pulse be produced.

The timer 31 produces an active low count pulse at its output, which is inverted by the inverter 40 to a high pulse, which is recognized by the counter/display 45. The counter/display is a totalizer with an LCD display and is incremented by one count with each input count pulse. The resistor 46 grounds the reset terminal of the counter/display 45, while allowing the user to reset the counter/display 45 by shorting the reset pin to the V+supply across the terminals 48 and 49. An appropriate reset switch button or the like (not shown) may be provided for this purpose.

When a battery pack successfully starts a vehicle, the vehicle's charging system will bring the battery pack voltage back up above its resting voltage of about 13 volts. To prevent a second count from occurring when the battery pack is removed from the running vehicle (allowing its voltage to drop to its resting level), the Zener diode 29 prevents the reference voltage from rising above its normal or reset level, thereby preventing a "double" count.

Voltage spikes can occur while connecting the battery pack 15 to, or disconnecting it from, a load. In order to protect the sensitive CMOS integrated circuits 21 and 31 from such voltage spikes, the Zener diode 17, which may be rated at 16 volts, prevents the V+supply voltage from rising above that level. The resistor 16 limits current through the diode 17 when the battery pack voltage exceeds the Zener voltage.

The counter/display 45 is normally powered through the diode 44. However, if the battery voltage drops below a pre-determined level, such as about 5 volts, the operation of the counter/display 45 may become erratic. In such an event, power is supplied from the high-value capacitor 46 to keep the counter/display 45 active for at least 30 seconds.

In a constructional model of the invention, the capacitors 26 and 34 may be 1 microfarad, the capacitors 36 and 37 may be 0.1 microfarad, the capacitor 46 may be 1000 microfarads, the Zener diode 29 may be a 13-volt, 1N4700, the Zener diode 17 may be a 16-volt 1N5246, the diode 33 may be an 1N914, the diode 44 may be an IN 4002, the IC timer 31 may be a TLC555, the transistor 41 may be a 2N3904, the counter/display IC 45 may be Curtis 17082-112, the resistor 16 may be 100 Kohm, the resistor 21a may be 10 Kohm, the resistors 22–25 may, respectively be 1 Kohm, 12 Mohm, 8.2 Mohm and 18 Mohm, the resistors 27, 28 and 35 may be 10 Mohm, the resistor 32 may be 430 Kohm, and the resistors 42, 43 and 46 may be 4.7 Kohm. With these component values, the usage counter circuit 10 draws less than one milliampere.

Accordingly, it can be seen that there has been provided a usage counter circuit which provides a simple means of counting the number of vehicles start attempts made using a jump-start battery pack, while placing a negligible additional load on the battery pack.

The matter set forth in the foregoing description and accompanying drawings is offered by way of illustration only and not as a limitation. While a particular embodiment has been shown and described, it will be apparent to those skilled in the art that changes and modifications may be made without departing from the broader aspects of applicants' contribution. The actual scope of the protection sought is intended to be defined in the following claims when viewed in their proper perspective based on the prior art.

We claim:

1. Apparatus for determining the cycle life of a battery in terms of usage cycles, comprising:

a reference circuit adapted to be coupled to the battery and establishing a reference voltage level, a usage cycle detection circuit adapted to be coupled to the battery and to the reference circuit and generating a count signal in response to battery voltage dropping below the reference voltage level, and a counter circuit coupled to the detection circuit for counting the number of count signals generated.

2. The apparatus of claim 1, wherein, the detection circuit includes an integrated-circuit comparator.

3. The counter of claim 1, wherein, the reference circuit includes a capacitor for maintaining the reference voltage level despite momentary drops in battery voltage.

4. The apparatus of claim 1, and further comprising a display for displaying the number of count signals generated.

5. The apparatus of claim 1, and further comprising a resistance and a Zener diode connectable in series across the battery terminals for providing to the usage cycle detection circuit and to the counter circuit a limited supply voltage which is not affected by voltage spikes which may occur at the battery terminals.

6. The apparatus of claim 1, wherein the counter circuit is an integrated circuit having supply voltage input terminals, and further comprising a capacitor connected across the supply voltage input terminals.

7. Apparatus for determining the cycle life of a battery in terms of usage cycles, comprising:

a reference circuit adapted to be coupled to the battery and establishing a reference voltage level, a comparator circuit adapted to be coupled to the battery and to the reference circuit and generating an output signal when battery voltage drops below the reference voltage level, a time delay circuit coupled to the comparator circuit and responsive to an output signal for generating a count signal if the output signal persists for a predetermined time period, and a counter circuit coupled to the time delay circuit for counting the number of count signals generated.

8. The apparatus of claim 7, wherein the time delay circuit is an RC circuit.

9. The apparatus of claim 7, wherein the predetermined time period is about ½ second.

10. The apparatus of claim 7, wherein the reference circuit includes a capacitor for maintaining the reference voltage level despite momentary drops in battery voltage.

11. The apparatus of claim 7, and further comprising a resistance and a Zener diode connectable in series across the battery terminals for providing to the usage cycle detection circuit and to the counter circuit a limited supply voltage which is not affected by voltage spikes which may occur at the battery terminals.

12. The apparatus of claim 7, and further comprising a display for displaying the number of count signals generated.

\* \* \* \* \*